United States Patent
Bouchez et al.

(10) Patent No.: US 6,513,718 B1
(45) Date of Patent: Feb. 4, 2003

(54) METHOD FOR MOUNTING A MICROCIRCUIT IN A CAVITY OF A CARD FORMING A SUPPORT AND RESULTING CARD

(75) Inventors: Francoise Bouchez, Verson (FR); Francois Launay, Epron (FR); Pierre Loubly, Caen (FR); Jacques Venambre, Ifs (FR)

(73) Assignee: Oberthur Card Systems SAS, Paris (FR)

( * ) Notice: Subject to any disclaimer, the term of this patent is extended or adjusted under 35 U.S.C. 154(b) by 0 days.

(21) Appl. No.: 09/563,904

(22) Filed: May 4, 2000

(30) Foreign Application Priority Data

May 6, 1999 (FR) .............................. 99 05778

(51) Int. Cl.[7] .............................................. G06K 19/06
(52) U.S. Cl. ........................ 235/492; 257/679; 438/118
(58) Field of Search ................................ 235/487, 492; 902/25, 26; 257/679, 676; 438/101, 118; 29/827

(56) References Cited

U.S. PATENT DOCUMENTS

| | | | | |
|---|---|---|---|---|
| 4,380,699 A | * | 4/1983 | Monnier et al. ............ 235/492 |
| 4,409,471 A | * | 10/1983 | Aigo ........................... 235/492 |
| 4,792,843 A | * | 12/1988 | Haghiri-Tehrani et al. .. 257/679 |
| 4,921,160 A | * | 5/1990 | Flynn et al. ................. 235/492 |
| 5,005,282 A | * | 4/1991 | Rose ........................... 29/827 |
| 5,055,913 A | * | 10/1991 | Haghiri-Tehrani .......... 257/676 |
| 5,057,679 A | * | 10/1991 | Audic et al. ................ 235/492 |
| 5,438,750 A | * | 8/1995 | Venambre ................ 235/492 X |
| 5,461,256 A | | 10/1995 | Yamada et al. ............. 257/679 |
| 5,585,669 A | * | 12/1996 | Venambre ................... 257/679 |
| 5,637,858 A | * | 6/1997 | Hoppe et al. ............... 235/492 |
| 5,721,451 A | * | 2/1998 | Settles et al. ............... 257/679 |
| 5,834,755 A | * | 11/1998 | Haghiri-Tehrani et al. .. 235/492 |
| 6,025,054 A | * | 2/2000 | Tiffany, III ............. 235/492 X |
| 6,069,027 A | * | 5/2000 | Mertol et al. ............... 438/118 |
| 6,084,500 A | * | 7/2000 | Kanetaka et al. ........... 336/223 |
| 6,208,019 B1 | * | 3/2001 | Tane et al. .................. 257/679 |
| 6,223,989 B1 | * | 5/2001 | Permingeat ................ 235/487 |
| 6,372,541 B1 | * | 4/2002 | Bouchez et al. ............ 438/106 |

FOREIGN PATENT DOCUMENTS

| | | |
|---|---|---|
| DE | 196 18 101 | 11/1997 |
| EP | 0 331 316 | 9/1989 |
| EP | 0 519 564 | 12/1992 |
| JP | 6-219087 A | * 8/1994 |

OTHER PUBLICATIONS

Permingeat, Smart card manufacturing procedure—fitting electronic module into matching cavity by pressing against adhesive applied to cavity centre and edges, 2/25/2998, translation of abstract of WO 9806062 A1 from Derwent database.*

* cited by examiner

Primary Examiner—Michael G. Lee
Assistant Examiner—Jared J. Fureman
(74) Attorney, Agent, or Firm—Browdy and Neimark

(57) ABSTRACT

To mount a microcircuit module in a cavity in a card forming a support, resin is deposited on the bottom of the cavity and the module is fitted in such a way that the microcircuit is coated with resin. A compressible annular area formed in the cavity completely surrounds the microcircuit and the coating material. The annular area extends over a continuous peripheral area of the bottom of the cavity.

22 Claims, 2 Drawing Sheets

METHOD FOR MOUNTING A MICROCIRCUIT IN A CAVITY OF A CARD FORMING A SUPPORT AND RESULTING CARD

BACKGROUND OF THE INVENTION

1. Field of the Invention

The invention relates to a method of mounting a microcircuit, previously mounted on a connecting board, inside a cavity prepared for this purpose in a card forming a support.

The invention relates more particularly to coating the microcircuit with a hardenable material of the polymerizable resin kind by a process that very greatly increases the resistance of the card to bending.

The invention also relates to any microcircuit card, commonly referred to as a "smart card", incorporating a structural feature resulting from use of the above method, as indicated hereinafter.

2. Description of the Prior Art

One of the most widely used methods of mounting a microcircuit in the cavity of a card entails first forming a module consisting of a connecting board of the printed circuit type, fixing the microcircuit to the board and then gluing the module into a blind cavity formed in the card. The expression "blind cavity" refers to a recess open on one face of the card and whose depth is less than the thickness of the card. The cavity therefore has a bottom consisting of a thinner part of the card. The microcircuit is usually connected by soldering wires to external contacts of the printed circuit. A protective resin is then deposited on the microcircuit before fitting the module into the cavity.

An ISO standard characterizes the resistance of the card to bending stresses. Mechanical bending cycles are applied to the card which must not break mechanically or electrically following a particular number of such bending cycles.

The mounting technique referred to above has the drawback of concentrating a major part of the mechanical bending stresses on the microcircuit itself. Attempts have been made to shift the extreme stress areas to areas external to the module. For example, weakened areas have been created external to the module by locally reducing the thickness of the support or applying reinforcing structures to the module. These methods have the following drawbacks:

The plastics material card is mechanically weakened in given areas, which can lead to the plastics material breaking in those areas.

The creation of weakened areas changes the visual appearance of the card with poor esthetic results. The structure is complex.

Another technique is described in European patent 0 519 564. In this technique, when fitting the module, the microcircuit is inserted into the cavity in the support after depositing in the cavity a protective resin that coats the microcircuit and fills substantially all of the cavity. This stiffens the area of the card containing the microcircuit, which protects it to some degree from mechanical bending stresses.

An annular rib machined into the bottom of the cavity confines the resin deposited before gluing to the center of the cavity. The rib is preferably discontinuous to enable excess resin to flow out towards the edges of the cavity when the microcircuit is pressed into the drop of resin. The object of this prior art technique is to fill the greater part of the cavity whilst preventing the resin overflowing when the module is fitted.

However, the rigid block consisting of the microcircuit and the resin transfers mechanical stresses to the perimeter of the cavity, to be more precise to the vicinity of the perimeter of the bottom of the cavity. During repeated bending cycles, the card tends to crack in this thin area.

The presence of the annular rib slows down machining and prevents the mounting of large integrated circuits in a cavity of given dimensions, other things being equal. The rib can also come into contact with the wires connecting the microcircuits to the connection areas, which can break the electrical connections to the microcircuit.

The invention proposes an improvement to the above technique for coating the microcircuit which, among other things, very significantly reduces the bending stresses in the vicinity of the periphery of the bottom of the cavity and eliminates the confinement rib.

A first aspect of the invention reduces the stresses transmitted to the periphery of the bottom of the cavity to a surprising degree merely by freeing this area of the resin for fixing and coating the microcircuit.

SUMMARY OF THE INVENTION

To be more precise, the invention relates to a method of mounting a microcircuit in a cavity in a card forming a support, in which method a module consisting of a connecting board carrying the microcircuit is formed and fixed to the card so that the microcircuit is housed in the cavity, the fixing of the module including coating the microcircuit with a coating material deposited on the bottom of the cavity and adhering thereto, for example a resin that is still liquid, and hardening the coating material, and a compressible annular area is formed in the cavity, completely surrounds the coating material and extends in part over a continuous peripheral area of the bottom of the cavity.

In a preferred embodiment of the invention at least part of the compressible annular area is formed by forming a ring of air in the cavity all around the coating material.

A thixotropic resin is preferably used. Thixotropic viscous substances lose some of their viscosity on agitation or rapid shear movement. At rest, the substance reverts to its initial viscosity. By an appropriate choice of its rest viscosity, a thixotropic resin in the liquid state, i.e. before it hardens, can be deposited on the bottom of the cavity, for example in the form of drops or beads, without spreading. When the resin is deposited, its viscosity decreases rapidly as it is expelled through the metering nozzle. Once deposited on the bottom of the cavity, it reverts to its initial high viscosity, which provides better control over the required distribution of the resin, and so the required ring of air is certain to be formed. When the resin has been spread after mounting the module, it retains its original viscosity and the shape of the ring of air obtained does not change during polymerization.

It is advantageous to apply localized surface treatment to the central area of the bottom of the cavity before depositing the resin. The treatment is preferably applied by means of a laser beam. This increases the surface energy of the central area and the bottom of the cavity then has two areas with different surface states substantially concentric with, and both extending beyond, the location of the microcircuit (at the center of the cavity). The spreading of the resin is then dependent on the shapes, dimensions and surface states of these areas.

More particularly, if the boundary between the treated central area and the untreated peripheral area, which has a lower surface energy, is substantially coincident with the required inside edge of the ring of air, the resulting configuration stops the resin spreading during mounting of the module. This confinement of the resin to the center of the cavity guarantees that the required ring of air is formed correctly. The behavior of the resin due to different surface states of concentric areas of the support is described in detail in U.S. patent application Ser. No. 09/563,910 now U.S. Pat. No. 6,372,541. filed conjointly with the present application.

Treating the surface of the central area of the bottom of the cavity also improves the adhesion of the resin. It must be possible to polymerize the resin under conditions that the other components can withstand. For example, the polymerization temperature must be less than the temperature at which the plastics material softens, i.e. from 50° C. to 80° C., depending on the material.

For example, good results have been obtained with an insulative epoxy resin which typically has a viscosity of the order of 2,900 cps (centipoises) and a thixotropic index (the ratio of the viscosity at 5 rpm to that at 50 rpm) of 2.8. Polymerization is obtained in 48 hours at room temperature. The Shore D hardness of the resin after polymerization is from 70 to 80. The plastics material constituting the card body in which the cavity is defined is advantageously a material of the polybutylene-terephthalate type. By combining all the above features it is possible to obtain a card able to resist more than 80,000 mechanical cycles in the direction of the shorter side of the card, as specified in the relevant ISO standard.

Other materials can be used for the card body. If polybutylene-terephthalate is used, as mentioned above, which is characterized by a low surface energy, the surface treatment of the bottom of the cavity is particularly recommended to achieve good adhesion of the resin. A significant improvement in adhesion has been obtained by surface treatment such as flame, corona or plasma treatment (with Ar or $Ar/O_2$). However, as mentioned above, the laser beam treatment has the additional advantage of making it easier to localize the surface treatment at the center of the bottom of the cavity, which provides the benefit of the phenomenon described hereinabove at the time of spreading the resin, and therefore better control over the formation of the ring of air.

In one variant, the compressible annular area can be obtained at least in part by placing in said cavity a ring of elastomer material extending all around the coating material. To be more precise, the ring of elastomer material can be deposited along the perimeter of the bottom of the cavity before applying the resin so that the resin is kept away from the perimeter of the bottom of the cavity, regardless of how it spreads. Forming a ring of air all around the coating material is the preferred solution, but it is also feasible to combine the two techniques, said compressible annular area being obtained by providing side-by-side in the cavity a ring of air and a ring of elastomer material.

The distribution of the resin over the bottom of the cavity is also important. The configuration of the deposit of resin is preferably determined by the shape of the cavity, in particular dictated by the shape of the perimeter of the bottom of the cavity and the geometry of the microcircuit concerned.

For example, if the bottom of the cavity has an at least approximately rectangular or oval contour, several drops of resin are preferably deposited to define a configuration that is substantially centered relative to the bottom of the cavity and approximately the same shape as the cavity so that when the microcircuit is placed in the cavity the drops intermingle and spread to form a ring of air along the walls of the cavity.

For example, for a rectangular cavity, it is sufficient to deposit on its bottom wall two drops offset in the lengthwise direction of said cavity along a median line thereof.

Another possibility is to deposit a plurality of small drops, i.e. in practice a dozen or more, defining an approximately rectangular or substantially oval configuration, elongate in the lengthwise direction of the respectively rectangular or oval cavity. To allow for the thickness of the microcircuit, the quantity of resin deposited at the center of the configuration is preferably less than that deposited on the other parts of the bottom.

The invention also relates to a microcircuit card including a cavity housing a module consisting of a connecting board carrying a microcircuit and a compressible annular area formed in the cavity, completely surrounding a material for coating the microcircuit between the module and the bottom of the cavity, and extending in part over a continuous peripheral area of the bottom of the cavity.

The invention will be better understood and other advantages of the invention will appear more clearly in the light of the following description of a method of mounting a microcircuit in a cavity in a card forming a support, which description is given by way of example only and with reference to the accompanying diagrammatic drawings.

DETAILED DESCRIPTION OF THE PREFERRED EMBODIMENT

Figure 1:
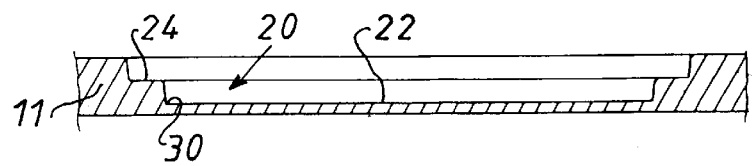
FIG. 1 is a partial view in section of a plastics material card in which a cavity has been formed.

FIGS. 1 to 5 show a method in accordance with the invention of mounting a microcircuit in a cavity in a card forming a support. The method starts from two conventional subassemblies, namely the card 11 forming the support, part of which is shown in FIG. 1, and a module 12 consisting of a connecting board 13 carrying the microcircuit 14. This module, known in the art, is shown in section in FIG. 4. The board 13 is a kind of printed circuit, with metallic connecting areas 18 on one face and the microcircuit 14 fixed to the other face. The inputs and outputs of the microcircuit on the face opposite the fixing face are connected by conductive wires 21 to the various connecting areas 18. To this end the wires pass through holes in the printed circuit. The fabrication of a module of this kind is well known in the art and will not be described in further detail.

The card 11 forming a support is a plastics material card which has a cavity 20 opening onto one face. The cavity is machined into the thickness of the card, for example, so that its bottom 22 is a thinner part of the card itself. The cavity has a flat bottom and its bottom wall 22 is of constant thickness. However, the cavity also has a shallow peripheral area 24 whose height corresponds to the thickness of the board 13 of the module 12 plus the thickness of glue needed to fix said module to this peripheral area. This kind of cavity structure is also known in the art. Machining can be replaced with hot stamping. The method uses a card of the above kind forming a support provided with a cavity as just described.

Figure 2:
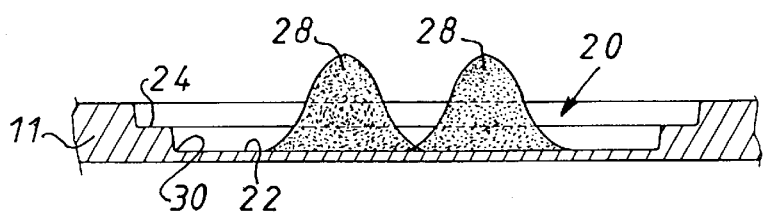
FIG. 2 shows the deposition of resin in the cavity.

A first process step shown in FIG. 2 consists of depositing a material for coating the microcircuit 14 onto the bottom of the cavity, for example a resin that is still liquid. The coating material is also intended to fix the microcircuit and the greater part of the module rigidly to the bottom wall 22.

In the example shown here, two droplets of resin 28 are deposited on the bottom of the cavity. The resin and the plastics material of the card are chosen so that said resin adheres to the bottom wall 22 of the cavity.

Figure 3:
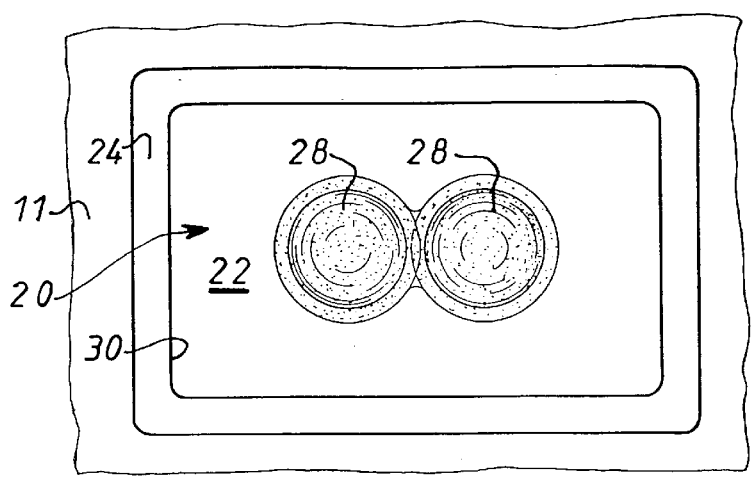
FIG. 3 is a plan view of FIG. 2.

As can be seen in FIG. 3, the cavity 20 has a rectangular contour and the resin is generally distributed over the bottom of the cavity in a configuration determined according to the shape of the cavity, more particularly according to the shape of the perimeter 30 of the bottom wall 22.

In this example, the configuration is one of the simplest possible, as it entails depositing two drops of resin side-by-side and offset in the lengthwise direction of the cavity. Nevertheless, these two drops of resin can be considered to define an overall configuration that is substantially centered relative to the bottom of the cavity and approximately the same shape as the cavity. In other words, referring to FIG. 3, the two offset drops can be considered to define an approximately rectangular perimeter configuration at the center of the bottom 22 of the cavity, the contour of the deposit of resin and the perimeter 30 of the bottom being approximately geometrically similar.

A thixotropic resin is preferably used with the characteristics indicated hereinabove. As a particular result of this, the resin does not spread over the bottom of the cavity during its deposition (see FIG. 2). The two drops shown can be deposited by means of syringes, enabling exact metering of the quantity of resin deposited on the bottom of the cavity.

However, FIG. 2 shows that the quantity of resin at the center of the configuration is smaller because the two spaced drops 28 intermingle soon after being deposited, because of the thixotropic nature of the resin. This smaller quantity of resin at the center of the configuration is advantageous because the thickness of the module at that location is increased by the thickness of the microcircuit.

Figure 4:
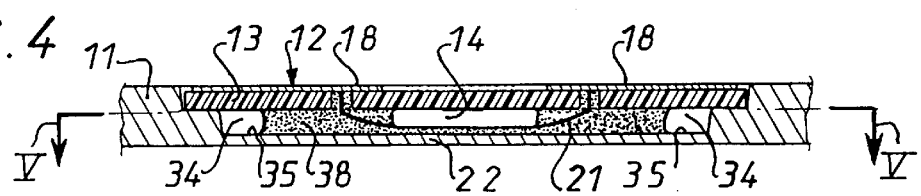
FIG. 4 shows the mounting of a module in the cavity.

After depositing the resin, glue can be deposited on the shallow peripheral area 24 before placing the module 12 in the cavity (see FIG. 4). This is known in the art.

According to a remarkable feature of the invention, the microcircuit 14 is completely coated in the resin, and at the same time there is formed in the cavity a compressible annular area completely surrounding the coating material, i.e. the resin, but extending in part over a continuous (and therefore annular) peripheral area 35 of the bottom wall 22 of the cavity.

In the example described hereinabove, the compressible annular area is provided by a ring of air 34 in the cavity which is formed all around the coating material when the module 12 is placed in the cavity 20. The thixotropic nature of the resin encourages the formation of this ring of air, because said resin becomes momentarily more fluid when the microcircuit 12 and the board 13 are pressed into the deposited resin. As soon as this operation is completed, the resin reverts to its initial viscosity and no longer advances toward the edge 30 of the bottom of the cavity. The continuous ring of air therefore surrounds a column of resin 38 between the module and the bottom of the cavity and with which the microcircuit is totally coated, but this column does not reach the edge 30 of the bottom of the cavity. The quantity of resin to be deposited in the cavity to obtain this result can be determined experimentally. It is clear that the total volume of resin must be significantly less than the difference between the volume of the deeper part of the cavity 20 and the volume of said microcircuit. The difference between these two volumes regulates the volume of the ring of air 34 and consequently the distance between the edge 30 of the bottom of the cavity and the column of resin.

When the module 12 has been fitted in the manner just described, its periphery is glued to the shallow peripheral area of the cavity and the next step is to polymerize the resin in the conventional way to harden the coating material constituting said column 38.

Figure 5:
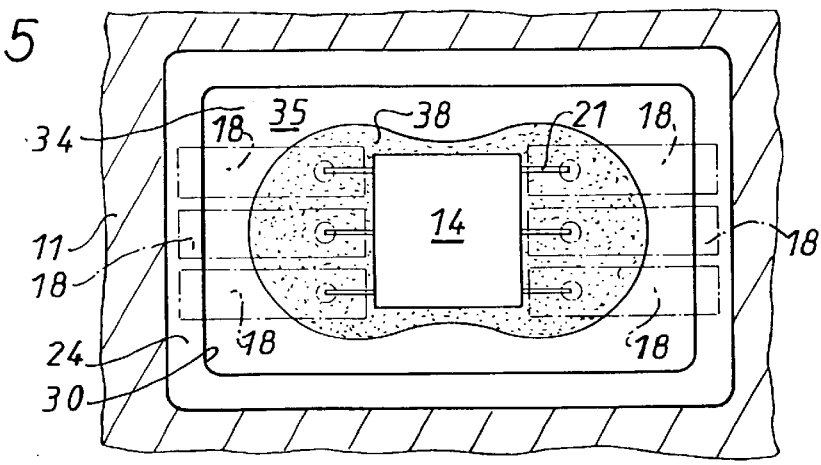
FIG. 5 is a view in section taken along the line V—V in FIG. 4.

FIG. 5 shows the shape of the ring of air 34 obtained with a deposit configuration comprising two spaced drops 28 of resin, as shown in FIGS. 2 and 3, the two drops intermingling shortly after they are deposited.

Generally speaking, if the cavity has an at least approximately rectangular or oval contour, several drops of resin are deposited to define a configuration that is substantially centered relative to the bottom 35 of the cavity and approximately the same shape as the latter.

Figure 6:
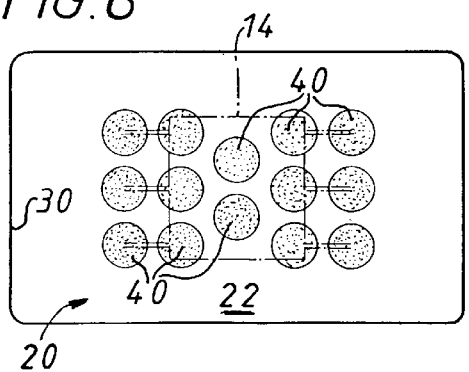
FIGS. 6 to 10 show other configurations of the resin deposit.

Considering FIG. 6, for example, the configuration in question is made up of a plurality of small drops 40 (i.e. at least three drops, there being 14 drops in the example) defining an approximately rectangular configuration which is elongate in the lengthwise direction of the bottom wall 22 of the rectangular cavity. Note, however, that only two drops 40 are deposited at the center of the configuration, rather than three. The quantity of resin is therefore smaller in this central region, to allow for the thickness of the microcircuit 14.

Figure 7:
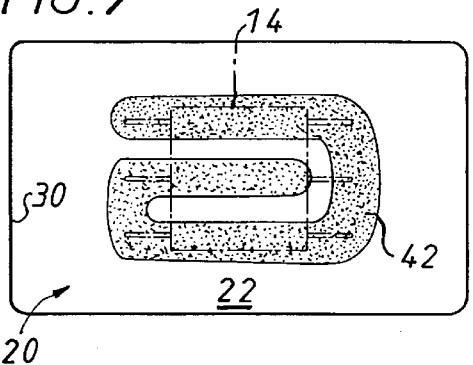

Another variant, shown in FIG. 7, entails depositing one or more beads of resin defining said configuration onto the bottom of the cavity. In this example, a spiral bead 42 is deposited, the outside shape of said configuration being globally similar to the shape of the perimeter 30 of the cavity.

Figure 8:
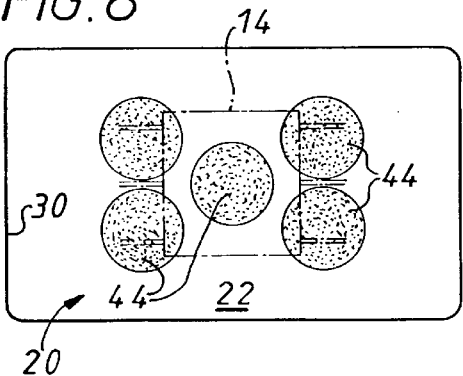

FIG. 8 shows another example in which said configuration is made up of a small number of medium-sized drops 44 (here there are 5 drops). Two groups of two drops spaced in the lengthwise direction of the cavity lie on respective opposite sides of a drop deposited at the center of the cavity. The drops are separate.

Figure 9:
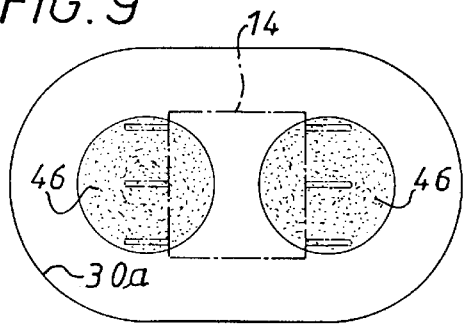
Figure 10:
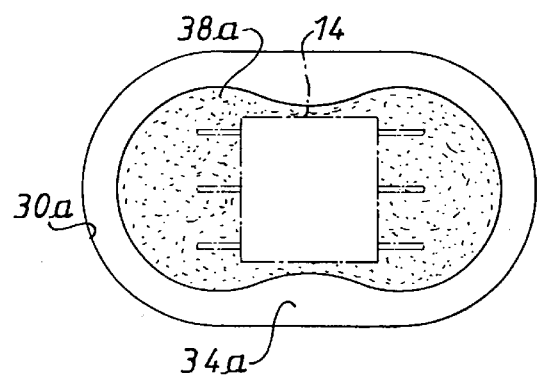

FIGS. 9 and 10 show an oval cavity configuration. The bottom of the cavity therefore has an oval perimeter 30a.

FIG. 9 shows that said configuration consists simply of two separate drops 46 spaced in the lengthwise direction of the oval cavity.

FIG. 10 shows the column of resin 38a after placing the module in the cavity and the resulting shape of the ring of air 34a created at the periphery of the module.

In all the examples shown in FIGS. 6 to 10 only the deeper part of the cavity is shown and the chain-dotted square indicates the position of the microcircuit 14 when the module is installed in said cavity.

Figure 11:
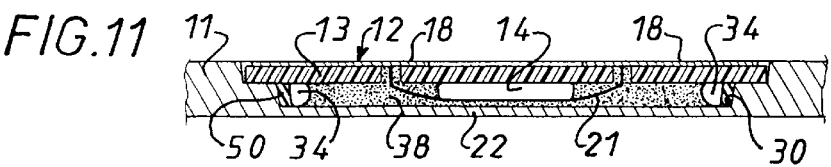
FIG. 11 shows a variant of the method.

FIG. 11 shows another variant of the method. In this variant, before the module 12 is fitted, a ring of elastomer material 50 is deposited at the perimeter of the deeper part of the cavity, for example by screenprinting or printing with a stamp. The deposit of elastomer material extends along the edge 30 of the bottom wall 22 of the cavity and covers its annular peripheral area. The ring of air is formed in the same way as previously. There are therefore formed side-by-side in the cavity a ring of air 34 and a ring of elastomer material 50, the combination constituting said compressible annular area. The elastomer ring guarantees the minimum dimension of the required compressible annular area at the periphery of the bottom of the cavity. It is even feasible, at the cost of very accurate metering of the quantity of resin introduced into the cavity, to eliminate the ring of air virtually completely.

It is important to remember that in all the examples previously described the resistance to bending is very significantly improved by this mounting method if the card is made from a plastics material such as polybutylene-terephthalate. This material offers high performance in bending, is highly resistant to the durability tests defined by the standard referred to hereinabove and is particularly suitable for fabricating a card having a compressible annular area at the periphery of the bottom of the cavity. The card can withstand up to 80,000 mechanical bending cycles according to the standard without the peripheral part of the bottom of the cavity breaking.

Note further that the volume of the ring of air is not critical provided that the resin does not reach the edge of the bottom of the cavity and that there is therefore some tolerance in terms of metering the volume of resin used to coat and protect the microcircuit.

Materials other than polybutylene-terephthalate can be used for the card forming the support, in particular PVC, ABS and PET.

There is claimed:

1. A method of mounting a microcircuit in a cavity in a card forming a support, the cavity being delimited by a bottom having a periphery and a side wall surrounding the bottom and extending upwardly from the periphery, in which method a module comprising a connecting board carrying a non-encapsulated microcircuit is formed and fixed to said card so that said non-encapsulated microcircuit is housed in said cavity, said fixing of said module including completely embedding said non-encapsulated microcircuit into a quantity of hardenable coating material deposited on the bottom of said cavity and adhering thereto, and hardening said coating material, the quantity of hardenable coating material being selected to cause the coating material, after having been hardened, to cover a first portion of the cavity bottom that is spaced from the periphery so that a second portion of the cavity bottom adjacent the periphery is not covered by the hardened coating material, thereby providing a compressible annular area in said cavity adjacent the periphery, which area completely surrounds said coating material and extends from the bottom of said cavity around a continuous peripheral area of said bottom of said cavity.

2. The method claimed in claim 1 wherein at least part of said compressible annular area is formed by forming a ring of air in said cavity all around said coating material.

3. The method claimed in claim 2 wherein at least part of said compressible annular area is formed by placing a ring of elastomer material in said cavity all around said coating material and said compressible annular area is formed by forming a ring of air and a ring of elastomer material side-by-side in said cavity.

4. The method claimed in claim 1 wherein at least part of said compressible annular area is formed by placing a ring of elastomer material in said cavity all around said coating material.

5. The method claimed in claim 1 wherein said ring of air is created by depositing on said bottom of said cavity a quantity of resin whose volume is significantly less than the difference between the volume of said cavity and the volume of said module and said module is fitted to said card so that said microcircuit is housed in said cavity.

6. The method claimed in claim 5 wherein a central area of said bottom of said cavity is surface-treated by means of a laser beam before depositing said resin.

7. The method claimed in claim 5 wherein a thixotropic resin is used.

8. The method claimed in claim 5 wherein said resin is distributed over said bottom of said cavity in a configuration determined by the shape of said cavity.

9. The method claimed in claim 8 wherein said cavity has an at least approximately rectangular or oval contour and a plurality of drops of resin are deposited defining a configuration substantially centered relative to said bottom of said cavity and approximately the same shape as said bottom of said cavity.

10. The method claimed in claim 9 wherein two drops offset in the lengthwise direction of said cavity are deposited.

11. The method claimed in claim 10 wherein a smaller quantity of resin is deposited at the center of said configuration.

12. The method claimed in claim 9 wherein a plurality of small drops are deposited defining a configuration which is elongate in the lengthwise direction of said cavity.

13. The method claimed in claim 12 wherein a spiral bead is deposited and the outside shape of said configuration is similar to the shape of the perimeter of said cavity.

14. The method claimed in claim 8 wherein said configuration is defined by depositing a bead of resin on said bottom of said cavity.

15. The method claimed in claim 1 wherein said card forming a support is made from a plastics material of the polybutylene-terephthalate type.

16. The method of claim 1, further comprising a preliminary step of giving the first and second portions of the cavity bottom respectively different surface states such that the surface state of the second portion inhibits a flow of hardenable coating material beyond the first portion.

17. The method of claim 1, wherein the cavity bottom is substantially flat.

18. A microcircuit assembly comprising: a card having a cavity, the cavity being delimited by a bottom having a periphery and a side wall surrounding the bottom and extending upwardly from the periphery; a module composed of a connecting board and a microcircuit carried by said board; and a single mass of coating material completely embedding said microcircuit and adhering said microcircuit to the bottom of said cavity, said mass of coating material being configured to cover a first portion of the cavity bottom that is spaced from the periphery so that a second portion of the cavity bottom adjacent the periphery is not covered by the hardened coating material, thereby forming a compressible annular area in said cavity, which area completely surrounds said mass coating material and extends from the bottom of said cavity around a continuous peripheral area of said bottom of said cavity.

19. The assembly claimed in claim 18 wherein said compressible annular area includes a ring of air.

20. The assembly claimed in claim 18 wherein said compressible annular area includes a ring of elastomer material.

21. The assembly of claim 18, wherein the first and second portions of the cavity bottom have respectively different surface states and the surface state of the second portion inhibits a flow of hardenable coating material beyond the first portion.

22. The assembly of claim 18, wherein the cavity bottom is substantially flat.

* * * * *